United States Patent
Chan et al.

(10) Patent No.: US 9,326,388 B2
(45) Date of Patent: Apr. 26, 2016

(54) FLEXIBLE DISPLAY APPARATUS AND MANUFACTURING METHOD THEREOF

(71) Applicant: E Ink Holdings Inc., Hsinchu (TW)

(72) Inventors: Lih-Hsiung Chan, Hsinchu (TW); Chu-Kuang Tseng, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 252 days.

(21) Appl. No.: 13/950,303

(22) Filed: Jul. 25, 2013

(65) Prior Publication Data

US 2014/0146491 A1  May 29, 2014

(30) Foreign Application Priority Data

Nov. 26, 2012  (TW) .............................. 101144165 A

(51) Int. Cl.
| | | |
|---|---|---|
| *B29C 65/52* | (2006.01) | |
| *B32B 37/12* | (2006.01) | |
| *B32B 43/00* | (2006.01) | |
| *H05K 3/32* | (2006.01) | |
| *H05K 1/18* | (2006.01) | |

(52) U.S. Cl.
CPC ............... *H05K 3/323* (2013.01); *H05K 1/189* (2013.01); *H05K 2201/10136* (2013.01); *H05K 2201/10977* (2013.01)

(58) Field of Classification Search
USPC .......................................................... 156/247
See application file for complete search history.

(56) References Cited

U.S. PATENT DOCUMENTS

| 6,266,872 B1* | 7/2001 | Fjelstad | ............... H01L 21/4846 257/E23.065 |
|---|---|---|---|
| 2004/0029383 A1* | 2/2004 | Tanaka | ................... C09J 7/0217 438/689 |
| 2006/0007381 A1* | 1/2006 | Sung | ................... G02F 1/13452 349/149 |
| 2010/0321282 A1* | 12/2010 | Lai | ......................... H05K 1/144 345/87 |
| 2010/0323576 A1* | 12/2010 | Hsiao | ................. G02F 1/133305 445/24 |

FOREIGN PATENT DOCUMENTS

| TW | 201120553 | 6/2011 |
|---|---|---|
| TW | 201214364 | 4/2012 |
| TW | 201220262 | 5/2012 |
| TW | 201235991 | 9/2012 |

OTHER PUBLICATIONS

"Office Action of Taiwan Counterpart Application", issued on Nov. 12, 2014, p. 1-p. 6.

\* cited by examiner

*Primary Examiner* — Sing P Chan
(74) *Attorney, Agent, or Firm* — Jianq Chyun IP Office

(57) ABSTRACT

A flexible display apparatus including a flexible display panel, at least one flexible circuit board, at least one driving chip, and a sealing layer is provided. The flexible display panel has a display area and a bonding area located outside the display area. The flexible circuit board is disposed in the bonding area of the flexible display panel. The driving chip is disposed on the flexible circuit board. The sealing layer encapsulates a periphery of the flexible display panel and extendedly covers the bonding area and a portion of the flexible circuit board.

6 Claims, 3 Drawing Sheets

FLEXIBLE DISPLAY APPARATUS AND MANUFACTURING METHOD THEREOF

CROSS-REFERENCE TO RELATED APPLICATION

This application claims the priority benefit of Taiwan application serial no. 101144165, filed on Nov. 26, 2012. The entirety of the above-mentioned patent application is hereby incorporated by reference herein and made a part of this specification.

BACKGROUND OF THE INVENTION

1. Field of the Invention

The invention relates to a display apparatus and a manufacturing method thereof, and more particularly to a flexible display apparatus and a manufacturing method thereof.

2. Description of Related Art

With rapid development of display technologies, conventional cathode ray tube (CRT) displays have been gradually replaced by flat panel displays (FPD). In comparison with the FPD formed by a rigid substrate (e.g. a glass substrate), a flexible display in which an active device is formed on a flexible substrate has been developed according to recent researches because the flexible substrate (e.g. a plastic substrate or a metal thin plate) is characterized by flexibility and impact endurance.

Generally speaking, if an active device is to be formed on a flexible substrate, the flexible substrate is often adhered to the rigid substrate, and then a series of transistor manufacturing process (a scan line, data line, pixel unit, storage capacitor, gate insulation layer, protection layer, and etc.) can be performed to form a flexible display panel. Thereafter, a driving chip (e.g. a scan driving chip and a data driving chip) is disposed on a trace layer in a periphery area of the flexible display panel by chip on glass (COG) bonding technique to be electrically connected to the driving chip and the flexible display panel. After all the processes are completely performed, the flexible display panel is removed from the rigid substrate.

However, since a pin of the driving chip has rigidity and is not flexible, when removing the flexible display panel from the rigid substrate, the pin of the driving chip is likely to be broken or the trace layer in the periphery area of the flexible display panel is likely to have a broken line or a break, causing a defect in the panel or reducing the reliability of the flexible display.

SUMMARY OF THE INVENTION

The invention provides a flexible display apparatus having a better reliability.

The invention provides a manufacturing method of a flexible display apparatus for manufacturing the aforementioned flexible display apparatus.

The invention provides a flexible display apparatus, including a flexible display panel, at least one flexible circuit board, at least one driving chip, and a sealing layer. The flexible display panel has a display area and a bonding area located outside the display area. The flexible circuit board is disposed in the bonding area of the flexible display panel. The driving chip is disposed on the flexible circuit board. The sealing layer encapsulates a periphery of the flexible display panel and extendedly covers the bonding area and a portion of the flexible circuit board.

In one embodiment of the invention, the flexible display apparatus further includes an anisotropic conductive film disposed between the flexible circuit board and the bonding area of the flexible display panel, wherein the flexible circuit board is electrically connected to the flexible display panel via the anisotropic conductive film.

In an embodiment of the invention, a location of the driving chip does not overlap with a location of the flexible display panel.

In an embodiment of the invention, the flexible display apparatus further includes an external circuit connected to the flexible circuit board; the flexible display panel is electrically connected to the external circuit via the flexible circuit board.

The invention further provides a manufacturing method of a flexible display apparatus, including steps of providing a rigid substrate, bonding a flexible display panel to the rigid substrate, wherein the flexible display panel has a display area and a bonding area located outside the display area, bonding at least one driving chip to the bonding area of the flexible display panel via at least one flexible circuit board, forming a sealing layer to encapsulate a periphery of the flexible display panel, wherein the sealing layer extendedly covers the bonding area of the flexible display panel and a portion of the flexible circuit board, and separating the flexible display panel from the rigid substrate.

In an embodiment of the invention, the step of bonding the flexible display panel to the rigid substrate includes forming an adhering layer on the rigid substrate and laminating the flexible display panel onto the adhering layer, wherein the flexible display panel is bonded to the rigid substrate via the adhering layer.

In an embodiment of the invention, the driving chip is disposed on the flexible circuit board, and the location of the driving chip does not overlap with the location of the flexible display panel.

In an embodiment of the invention, the flexible circuit board is bonded to the bonding area of the flexible display panel via an anisotropic conductive film.

In an embodiment of the invention, the manufacturing method of the flexible display apparatus further includes performing a heating or an ultra-violet light illumination step before separating the flexible display panel from the rigid substrate so as to cure the sealing layer.

In an embodiment of the invention, the manufacturing method of the flexible display apparatus further includes bonding an external circuit to the flexible circuit board after separating the flexible display panel from the rigid substrate, wherein the flexible display panel is electrically connected to the external circuit via the flexible circuit board.

Based on the above, since the flexible display apparatus in the embodiments of the invention adopts a chip on film (COF) technique that allows the driving chip to be disposed on the flexible display panel, when separating the flexible display panel from the rigid substrate, the driving chip disposed on the flexible circuit board is not bended easily (the flexible circuit board is the one bended by stress). Therefore, the situation in which the pin of a conventional driving chip is broken may be avoided. In addition, since the flexible display apparatus in the embodiments of the invention has a sealing layer, wherein the sealing layer encapsulates the periphery of the flexible display panel and extendedly covers the bonding area and the flexible circuit board, when separating the flexible display panel from the rigid substrate, the sealing layer may reinforce a structure strength between the flexible display panel and the flexible circuit board so as to further enhance an overall structural reliability of the flexible display apparatus.

In order to make the aforementioned features and advantages of the invention more comprehensible, embodiments accompanying figures are described in detail below.

DESCRIPTION OF EMBODIMENTS

Figure 1A:
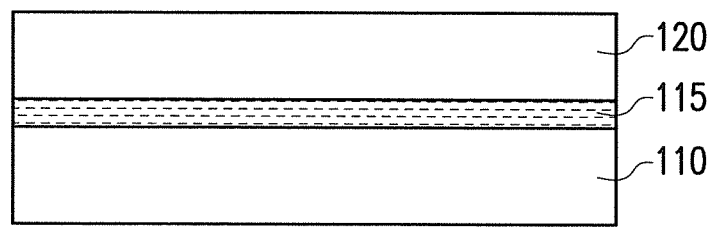
FIGS. 1A to 1D illustrate a schematic cross-sectional view of a manufacturing method of a flexible display apparatus in an embodiment of the invention.

FIGS. 1A to 1D illustrate a schematic cross-sectional view of a manufacturing method of a flexible display apparatus in an embodiment of the invention. FIG. 2 illustrates a schematic top view of the flexible display apparatus in FIG. 1D. As indicated in FIG. 1A, according to the manufacturing method of a flexible display apparatus in the embodiment, first of all, a rigid substrate 110 is provided, wherein the rigid substrate 110 is, for example, a glass substrate or a substrate formed of other appropriate materials for being used as a supporter.

Next, please refer to both FIGS. 1A and 2. A flexible display panel 120 is bonded to the rigid substrate 110, wherein the flexible display panel 120 has a display area 121 and a bonding area 123 located outside the display area 121. In the embodiment, a shape of the bonding area 123 of the flexible display panel 120 is, for example, in an L shape, however, the invention is not limited thereto.

More specifically, the flexible display panel 120 in the embodiment is bonded to the rigid substrate 110 via an adhering layer 115. In the embodiment, the flexible display panel 120 may be a flexible crystal liquid display panel, a flexible electrophoretic display panel, or a flexible organic electroluminescent display panel, however, the invention is not limited thereto.

Figure 1B:
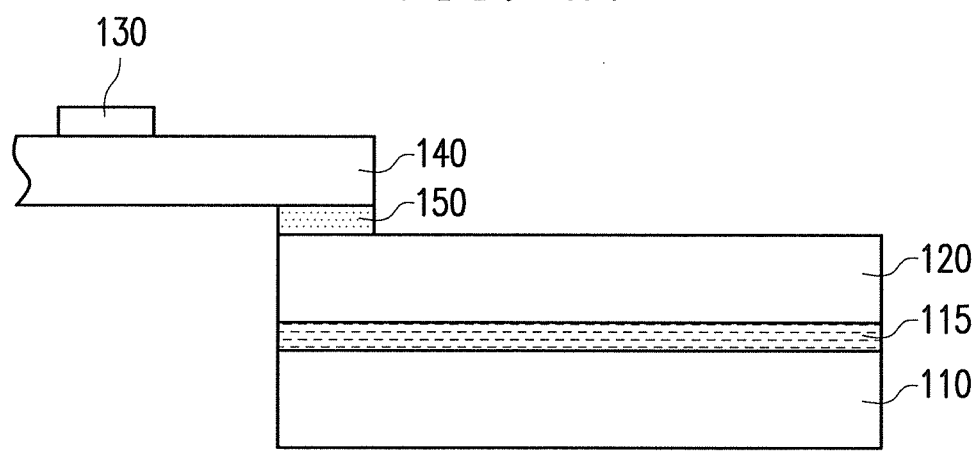
Figure 2:
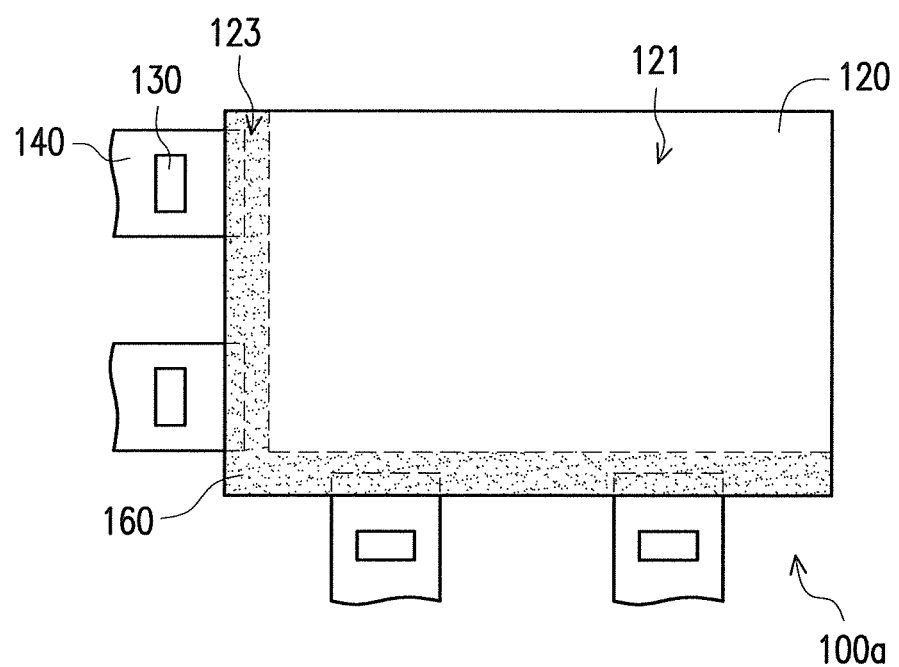
FIG. 2 illustrates a schematic top view of the flexible display apparatus in FIG. 1D.

With reference to both FIGS. 1B and 2, at least one driving chip 130 (a plurality of driving chips are schematically illustrated in FIG. 2) is bonded to the bonding area 123 of the flexible display panel 120 via at least one flexible circuit board 140 (a plurality of flexible circuit boards are schematically illustrated in FIG. 2). In the embodiment, the driving chips 130 are respectively disposed on the flexible circuit board 140, and the flexible circuit boards 140 are bonded to the bonding area 123 of the flexible display panel 120 via an anisotropic conductive film 150. Specifically, locations of the driving chips 130 in the embodiment do not overlap with a location of the flexible display panel 120. In the embodiment, the driving chips 130 are, for example, signal line driving chip or scan line driving chip, however, the invention is not limited thereto.

Figure 1C:
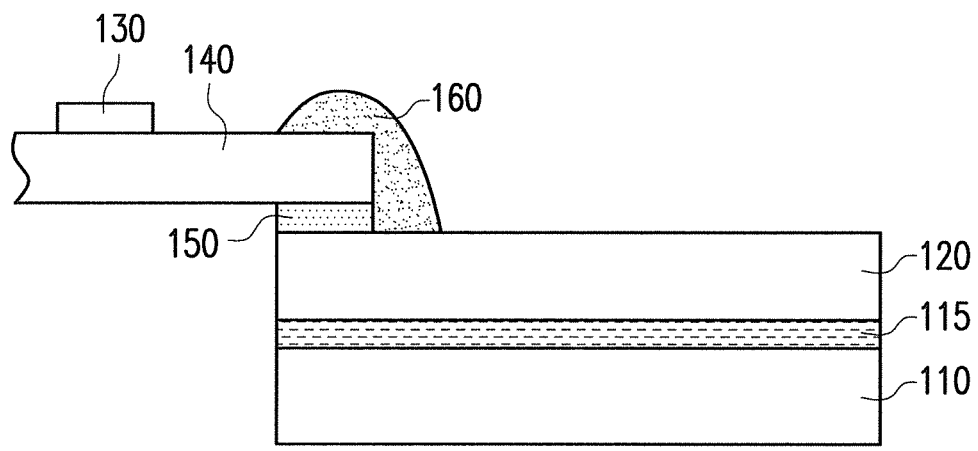

With reference to both FIGS. 1C and 2, a sealing layer 160 is formed to encapsulate a periphery of the flexible display panel 120, wherein the sealing layer 160 extendedly covers the bonding area 123 of the flexible display panel 120 and a portion of the flexible circuit boards 140. Next, a heating step or a ultra-violet light illumination step is performed to cure the sealing layer 160, wherein the sealing layer 160 may reinforce a structural strength between the flexible display panel 120 and the flexible circuit boards 140.

Figure 1D:
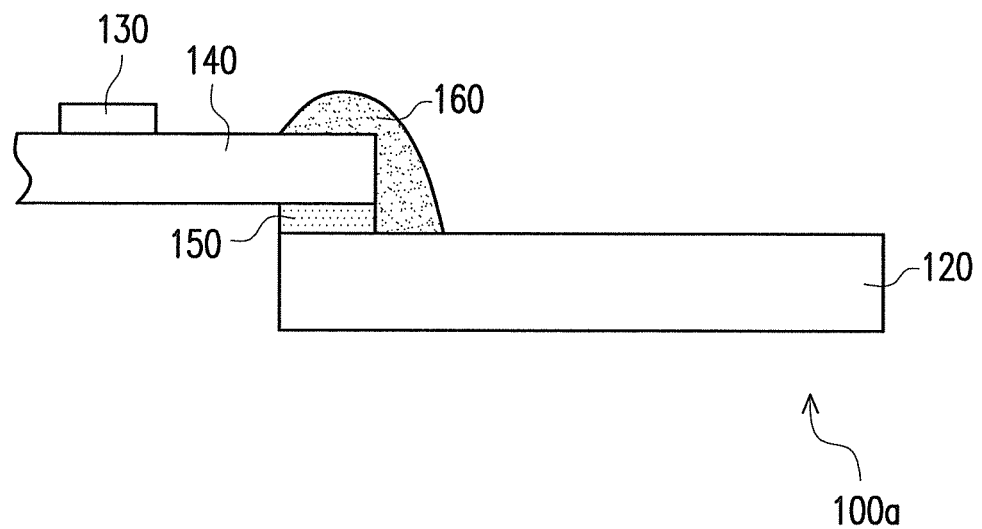

Finally, with reference to both FIGS. 1D and 2, the flexible display panel 120 is separated from the rigid substrate 110 to form a flexible display apparatus 100a, which is the final step of completing manufacturing the flexible display apparatus 100a.

Regarding the structure, with reference to both to FIGS. 1D and 2 again, the flexible display apparatus 100a in the embodiment includes the flexible display panel 120, the driving chips 130, the flexible circuit boards 140, and the sealing layer 160. The flexible display panel 120 has a display area 121 and the bonding area 123 located outside the display area 121. The flexible circuit boards 140 are disposed in the bonding area 123 of the flexible display panel 120. The driving chips 130 are disposed on the flexible circuit boards 140. The sealing layer 160 encapsulates the periphery of the flexible display panel 120 and extendedly covers the bonding area 123 and the portion of the flexible circuit boards 140. In the embodiment, the flexible circuit boards 140 are electrically connected to the flexible display panel 120 via the anisotropic conductive film 150, and the locations of the driving chips 130 do not overlap with the location of the flexible display panel 120.

Since the driving chips 130 of the flexible display apparatus 100a in the embodiment are disposed on the flexible display panel 120 via the flexible circuit boards 140 (i.e. the chip on film (COF) technique), when separating the flexible display panel 120 from the rigid substrate 110, the driving chips 130 disposed on the flexible circuit boards 140 are not bended easily (the flexible circuit boards 140 are the one bended by stress). Therefore, the situation in which the pin of a conventional driving chip is broken may be avoided. In addition, since the flexible display apparatus 100a in the embodiment has the sealing layer 160, wherein the sealing layer 160 encapsulates the periphery of the flexible display panel 120 and extendedly covers the bonding area 123 and the flexible circuit boards 140, when separating the flexible display panel 120 from the rigid substrate 110, the sealing layer 160 may reinforce a structure strength between the flexible display panel 120 and the flexible circuit boards 140 so as to further enhance an overall structural reliability of the flexible display apparatus 100a. In brief, the flexible display apparatus 100a in the embodiment has a higher structural reliability.

It needs to be indicated that the reference numbers and a part of the content referred in the previous embodiments are recited in the following embodiments, wherein the same reference numbers are used to represent the same or similar devices, and the description of the same technical content is omitted. Please refer to the previous embodiments for the omitted description. The same description is not repeated in the following embodiments.

Figure 3:
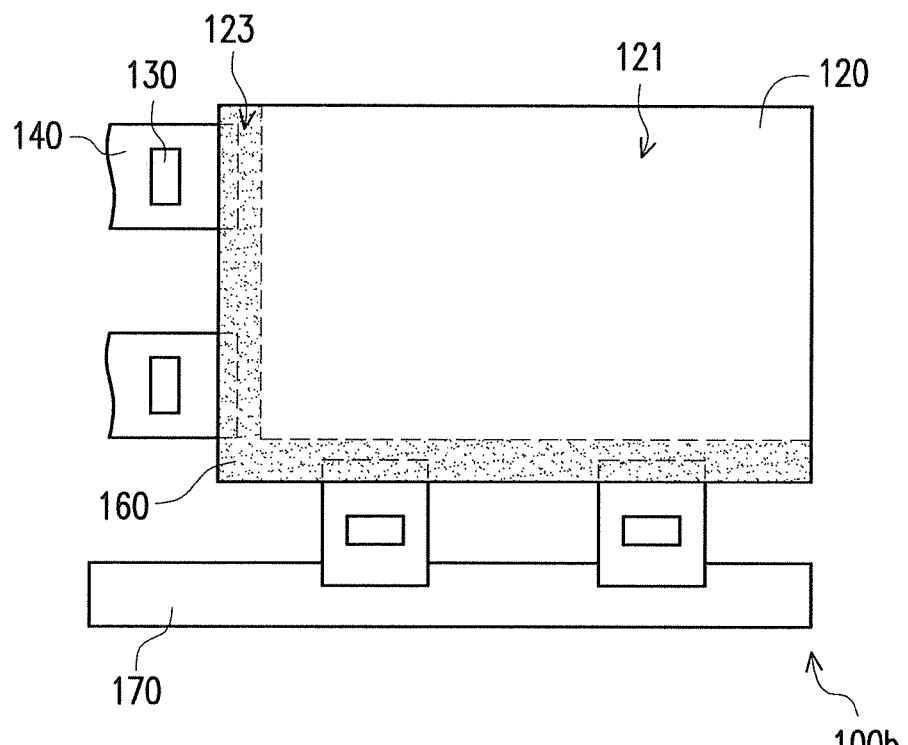
FIG. 3 illustrates a schematic top view of a flexible display apparatus in another embodiment of the invention.

FIG. 3 illustrates a schematic top view of a flexible display apparatus in another embodiment of the invention. With reference to both FIGS. 2 and 3, a flexible display apparatus 100b in FIG. 3 is similar to the flexible display apparatus 100a in FIG. 2, while the main difference therebetween lies in that the flexible display apparatus 100b in the embodiment further includes an external circuit 170, wherein the external circuit 170 is connected to a portion of the flexible circuit boards 140 and the flexible display panel 120 is electrically connected to the external circuit 170 via the flexible circuit boards 140. In the embodiment, the external circuit 170 is, for example, a flexible printed circuit (FPC) board, but the invention is not limited thereto.

In the process, the flexible display apparatus 100b in the embodiment may be manufactured by a similar method to that of the flexible display apparatus 100a in the previous embodiment. Furthermore, after separating the flexible display panel 120 from the rigid substrate 110, an external circuit 170 is bonded to the portion of the flexible circuit boards 140 such that the flexible display panel 120 is electrically connected to the external circuit 170 via the flexible circuit boards 140 to complete manufacturing the flexible display apparatus 100b.

Figure 4:
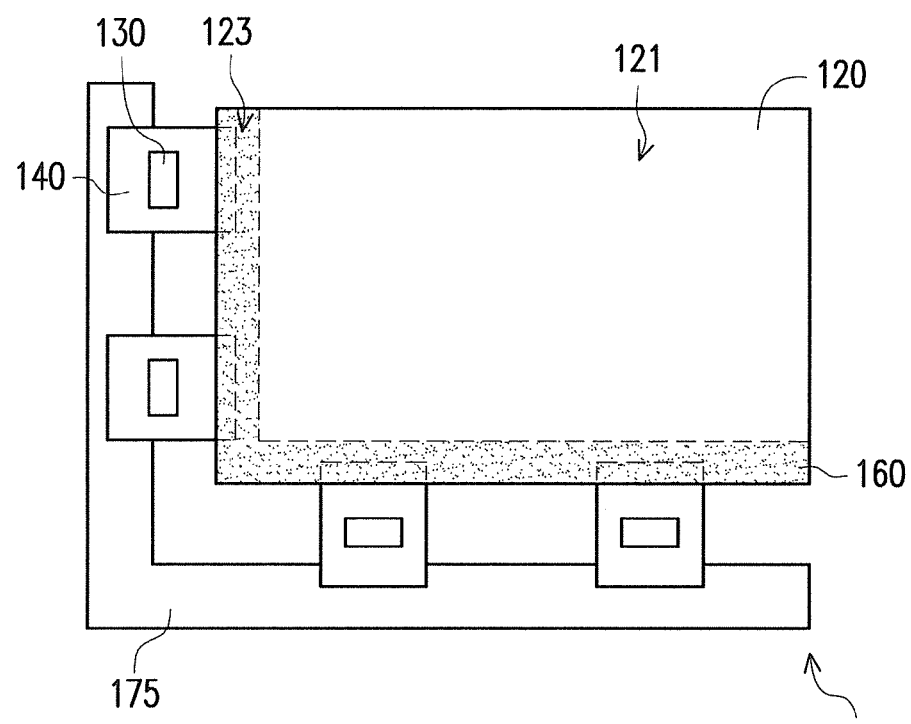
FIG. 4 illustrates a schematic top view of a flexible display apparatus in another embodiment of the invention.

It should be mentioned that the invention provides no limitation to the shape structure and disposition of the external circuit 170. Although the specific shape of the external circuit 170 referred in the embodiment is in a rectangle and is electrically connected only to the portion of the flexible circuit boards 140, in other embodiments, please refer to FIG. 4, a shape of the external circuit 175 may also be in an L shape and the external circuit 175 is electrically connected to the whole flexible circuit boards 140, which is also an adoptable technical solution in the invention and does not depart from the scope to be protected in the invention.

To sum up, since the flexible display apparatus in the embodiments of the invention adopts a chip on film (COF) technique that allows the driving chip to be disposed on the flexible display panel, when separating the flexible display panel from the rigid substrate, the driving chip disposed on the flexible circuit board is not bended easily (the flexible circuit board is the one bended by stress). Therefore, the situation in which the pin of a conventional driving chip is broken may be avoided. In addition, since the flexible display apparatus in the embodiments of the invention has a sealing layer, wherein the sealing layer encapsulates the periphery of the flexible display panel and extendedly covers the bonding area and the flexible circuit board, when separating the flexible display panel from the rigid substrate, the sealing layer may reinforce a structure strength between the flexible display panel and the flexible circuit board so as to further enhance an overall structural reliability of the flexible display apparatus.

It will be apparent to those skilled in the art that various modifications and variations can be made to the structure of the disclosed embodiments without departing from the scope or spirit of the invention. In view of the foregoing, it is intended that the disclosure cover modifications and variations of this specification provided they fall within the scope of the following claims and their equivalents.

What is claimed is:

1. A manufacturing method of a flexible display apparatus, comprising:
    providing a rigid substrate;
    bonding a flexible display panel to the rigid substrate, wherein the flexible display panel has a display area and a bonding area located outside the display area;
    at least one driving chip is bonded to the bonding area of the flexible display panel via at least one flexible circuit board;
    forming a sealing layer to encapsulate a periphery of the flexible display panel, wherein the sealing layer extendedly covers the bonding area of the flexible display panel and a portion of the flexible circuit board; and
    separating the flexible display panel from the rigid substrate.

2. The manufacturing method of the flexible display apparatus as recited in claim 1, wherein the step of bonding the flexible display panel to the rigid substrate comprises:
    forming an adhesive layer on the rigid substrate; and
    laminating the flexible display panel onto the adhesive layer, wherein the flexible display panel is bonded to the rigid substrate via the adhesive layer.

3. The manufacturing method of the flexible display apparatus as recited in claim 1, wherein the driving chip is disposed on the flexible circuit board, and a location of the driving chip does not overlap with a location of the flexible display panel.

4. The manufacturing method of the flexible display apparatus as recited in claim 1, wherein the flexible circuit board is bonded to the bonding area of the flexible display panel via an anisotropic conductive film.

5. The manufacturing method of the flexible display apparatus as recited in claim 1, further comprising:
    before separating the flexible display panel from the rigid substrate, performing a heating step or an ultra-violet light illumination step to cure the sealing layer.

6. The manufacturing method of the flexible display apparatus as recited in claim 1, further comprising:
    after separating the flexible display panel from the rigid substrate, bonding an external circuit to the flexible circuit board, wherein the flexible display panel is electrically connected to the external circuit via the flexible circuit board.

* * * * *